(12) United States Patent
Hayashi

(10) Patent No.: US 7,302,378 B2
(45) Date of Patent: Nov. 27, 2007

(54) ELECTROSTATIC DISCHARGE PROTECTION DEVICE MODELING METHOD AND ELECTROSTATIC DISCHARGE SIMULATION METHOD

(75) Inventor: Hirokazu Hayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 347 days.

(21) Appl. No.: 10/933,271

(22) Filed: Sep. 3, 2004

(65) Prior Publication Data

US 2005/0065762 A1 Mar. 24, 2005

(30) Foreign Application Priority Data

Sep. 18, 2003 (JP) ............... 2003-326333

(51) Int. Cl.
*G06F 17/50* (2006.01)

(52) U.S. Cl. ............... 703/14; 703/13; 703/19; 716/14

(58) Field of Classification Search ............ 703/13–18, 703/23, 28; 361/56; 257/360
See application file for complete search history.

(56) References Cited

U.S. PATENT DOCUMENTS

| | | | | |
|---|---|---|---|---|
| 5,166,624 A | * | 11/1992 | Abernathy | ............... 324/452 |
| 5,751,525 A | * | 5/1998 | Olney | ............... 361/56 |
| 5,796,638 A | * | 8/1998 | Kang et al. | ............... 716/5 |
| 5,949,694 A | * | 9/1999 | Amerasekera et al. | ......... 716/5 |
| 5,999,719 A | * | 12/1999 | Asada et al. | ............... 703/12 |
| 6,327,555 B1 | * | 12/2001 | Shimizu et al. | ............... 703/12 |
| 6,476,449 B1 | * | 11/2002 | Lin | ............... 257/360 |
| 6,493,850 B2 | * | 12/2002 | Venugopal et al. | ............ 716/4 |
| 6,515,331 B1 | | 2/2003 | Carneiro et al. | |
| 6,539,531 B2 | * | 3/2003 | Miller et al. | ............... 716/15 |
| 6,553,542 B2 | * | 4/2003 | Ramaswamy et al. | ......... 716/2 |
| 6,581,028 B1 | | 6/2003 | Hayashi | |
| 6,591,233 B1 | * | 7/2003 | Sonoda | ............... 703/14 |
| 6,858,900 B2 | * | 2/2005 | Chen et al. | ............... 257/360 |
| 2002/0144213 A1 | * | 10/2002 | Ramaswamy et al. | ......... 716/2 |
| 2002/0152447 A1 | * | 10/2002 | Venugopal et al. | ............ 716/4 |
| 2003/0081363 A1 | * | 5/2003 | Kawashima et al. | ......... 361/56 |
| 2003/0082839 A1 | * | 5/2003 | Kitamaru et al. | ............... 438/14 |

FOREIGN PATENT DOCUMENTS

JP 2001-339052 7/2001

OTHER PUBLICATIONS

Ajith Amerasekera, ESD in Silicon Integrated Circuits, 2nd Edition, Chapter 10: Device Modeling of High Current Effects, John Wiley & Sons Ltd., Apr. 2002.*

(Continued)

*Primary Examiner*—Weilun Lo
*Assistant Examiner*—Eric A Wiener
(74) *Attorney, Agent, or Firm*—Takeuchi & Kubotera, LLP

(57) ABSTRACT

An ESD protection device modeling method of modeling an electrical characteristic of an electrostatic discharge (ESD) protection device for simulating a circuit that include the ESD protection device, comprising the steps of (114) setting a parameter of at least one specific element that affects the electrical characteristic of the ESD protection device; and (116) modeling the electrical characteristic of the ESD protection device with the parameter of the specific element.

8 Claims, 14 Drawing Sheets

OTHER PUBLICATIONS

Ajith Amerasekera, ESD in Silicon Integrated Circuits, 2nd Edition, Chapter 11: Circuit Simulation Basics, Approaches, and Applications, John Wiley & Sons Ltd., Apr. 2002.*

Sridhar Ramaswamy, "Circuit-level Simulation of CDM-ESD and EOS in Submicron MOS Devices," Electrical Overstress/Electrostatic Discharge Symposium 1996 Proceedings, Sep. 1996.*

V. Axelrad, "Investigations of Salicided and Salicide-Blocked MOSFETs for ESD Including ESD Simulation," SISPAD 2001, Athens, Greece.*

Naoyuki Shigyo, "An Explicit Expression for Surface Potential at High-End of Moderate Inversion," IEEE Transactions on Electron Devices, vol. 49, No. 7, Jul. 2002.*

Carlos H. Diaz, "Circuit-Level Electrothermal Simulation of Electrical Overstress Failures in Advances MOS I/O Protection Devices," IEEE Transactions on Comupter-Aided Design of Integrated Circuits and Systems, vol. 13, No. 4, Apr. 1994.*

Carlos H. Diaz, "New Algorithms for Circuit Simulation of Device Breakdown," IEEE Transactions of Computer-Aided Design, vol. 11, No. 11, Nov. 1992.*

Carlos H. Diaz, "Simulation of Electrical Overstress Thermal Failures in Integrated Circuits," IEEE Transactions on Electron Devices, vol. 41, No. 3, Mar. 1994.*

Amerasekera et al., Modeling MOS Snapback and Parasitic Bipolar Action for Circuit-Level ESD and High Current Simulations, journal, 1996, 318-326, University of Illinois at Urbana-Champaign, Urbana, IL.

* cited by examiner

【図6B】

【図6D】

[図6F]

【図6H】

【図11】

ELECTROSTATIC DISCHARGE PROTECTION DEVICE MODELING METHOD AND ELECTROSTATIC DISCHARGE SIMULATION METHOD

BACKGROUND OF THE INVENTION

1. Field of the Invention

The present invention relates to an electrostatic discharge (ESD) protection device modeling method of modeling the electrical characteristic of an electrostatic discharge (ESD) protection device to simulate a circuit that includes the ESD protection device and an ESD simulation method of simulating the ESD protection device.

2. Description of the Related Art

In recent years, the ESD destruction of a device becomes a serious problem in the large scale integration or miniaturization of semiconductor integrated circuits and the self-aligned silicide (Salicide) process for reducing the resistance between devices, making it necessary to use an ESD protection device. The conventional ESD protection device and ESD protection circuit simulation, however, are very complicated and difficult to set each parameter for modeling the device.

For example, Japanese Patent Application Kokai No. 2001-339052 discloses a method of simulating a protective circuit against the ESD destruction. That is, to model an ESD protection device, first, a model for the equivalent circuit of an ESD protection device is made, and measurement is taken for the device made by the final process or the physical parameter is extracted from the electrical characteristic obtained by the device simulation to form an equivalent circuit. Then, 100 or more model parameters of the equivalent circuit must be further fitted or adjusted.

This method is applicable to a relatively large IC by way of the equivalent circuit of the ESD protection device. However, the formation of the equivalent circuit needs the adjustment of many parameters. In addition, if the production process is changed by circuit correction, for example, no simple operation, such as parameter change, can solve the problem. That is, if the production process is changed, the model parameters for the previous modeling are no longer useable, and the model parameters for forming the equivalent circuit must be adjusted again. Moreover, the above method is only a circuit simulation and fails to specify the destruction location by ESD.

SUMMARY OF THE INVENTION

Accordingly, it is an object of the invention to provide an ESD protection device modeling method capable of predicting the characteristic of an ESD protection device with simple steps and, if the production process is changed, predicting the characteristic change of the ESD protection device, the ESD destruction location, and the ESD resistance by using the previous parameters, and an ESD simulation method.

According to an aspect of the invention there is provided an ESD protection device modeling method of modeling an electrical characteristic of a protection device against electrostatic discharge or ESD protection device for simulating a circuit that include the ESD protection device, comprising the steps of setting a parameter of at least one specific element that affects the electrical characteristic of the ESD protection device; and modeling the electrical characteristic of the ESD protection device with the parameter for the specific element. The simulation including the ESD protection device may be a device simulation that physically simulates the electrical state of the device.

To model the ESD protection device, at least one specific element is extracted, and the parameter for each specific element is set independently to form the characteristic of the ESD protection device. Especially, where the production process is changed due to a circuit correction, the parameter of only the specific element affected by the process change is changed to predict the characteristic change of the ESD protection circuit without difficulty.

In addition, prior to the parameter setting step, the step of forming an impurity profile representing a density distribution of an impurity in the ESD protection device obtained by secondary ion mass spectrometry (SIMS) to determine the parameter of the ESD protection device may be included. The parameter of the specific element may be determined according to the impurity profile.

The impurity profile may be formed by the process simulation for the production process. Also, it is possible to use the inverse modeling technology that uses the measured electrical characteristic of the device to extract the impurity profile by simulation. The parameter of at least one specific element is determined by the thus formed impurity profile. In the parameter setting step, the parameter for a specific element other than the above determined specific element is set.

The parameter setting step may include the step of comparing a snapback characteristic of a voltage/current characteristic of the ESD protection device measured by transmission line pulse (TLP) measurement for evaluating the electrical characteristic of the ESD protection device and a snapback characteristic corresponding to the specific element to set a parameter of the specific element such that a snapback characteristic of combination of the specific elements is substantially equal to the snapback characteristic by the TLP measurement. The specific element depending snapback characteristic may have been measured for a plurality of parameters for each specific element.

The TLP measurement is made by applying a current pulse having a predetermined width to the device to provide the voltage/current characteristic, especially for the d-c component, of the device. The snapback characteristic is the drain voltage/drain current characteristic, with the gate and source voltage fixed at 0 V, showing a snapback action. The snapback action is characterized by the avalanche breakdown due to the increased train voltage, the substantially constant holding voltage capable of conducting a predetermined current after the avalanche breakdown, and the thermal runaway (device destruction) where current higher than the above current is conducted. The ESD protection device makes use of such a snapback characteristic to conduct the ESD current through the ESD protection device, thus protecting the other circuit.

With this structure, it is possible to predict the parameter of each specific element by referring to the snapback characteristic curve of an actual ESD protection device. The snapback characteristic of a specific element varies with the parameter so that the parameter can be determined. By combining with the profile forming step it is possible to limit the parameter to be determined, making possible to set a more accurate parameter. If the production process is changed, by comparing the snapback characteristic before and after the change, it is possible to predict which process affects which specific element.

The parameter setting step further includes the step of comparing a current transient characteristic measured by conducting current through the ESD protection device and the specific element depending current transient characteristic to set a parameter of the specific element such that a current transient characteristic of combination of the specific elements is substantially equal to the measured current transient characteristic. The specific element depending current transient characteristic may have been measured for a plurality of parameters for each specific element.

In view of the waveform of current transient characteristic of an actual device, it is possible to predict the parameter of each specific element. The current transient characteristic of each specific element varies with the parameter so that the parameter can be determined from the characteristic of the specific element. By combining with the profile forming step, it is possible to limit the parameter to be determined, making it possible to set a more accurate parameter. If the production process is changed, by comparing the current transient characteristic before and after the change, it is possible to predict which process affects which specific element.

By comparing the current transient characteristic after the parameter is set by comparison of the snapback characteristics, it is possible to finely adjust the parameter. With this structure, it is possible to form an appropriate transient characteristic including a characteristic for the d-c component of the ESD protection device and to raise the reliability of the parameter for the modeled ESD protection device.

Where the ESD protection device is made up of a plurality of ESD protection elements, the parameter setting step further may include the step of comparing a total current transient characteristic measured by conducting current through the ESD protection elements a current transient characteristic of each ESD protection element to set a parameter for a current ratio such that the current transient characteristic of combination of the ESD protection elements is substantially equal to the measured total current transient characteristic.

The parameter for a current ratio includes the wiring resistance connected to respective ESD protection elements, and only the ratio of currents through the ESD protection device can be changed without changing the parameter of the already set specific element. With such a structure, it is possible to provide a more accurate model of the ESD protection device.

Where the ESD protection device is composed of a plurality of ESD protection elements, the parameter setting step further may include the step of comparing a current branching rate obtained by conducting current through the ESD protection elements to measure the ratio of currents through the respective ESD protection elements and a current branching rate of each ESD protection element in the simulation to set a parameter for a current ratio such that a current branching rate obtained by combination of the ESD protection elements is substantially equal to the measured current branching rate.

With such a structure as stated above, only the ratio of currents through the ESD protection device can be changed without changing the parameter of the already set specific element, thus providing a more accurate model of the ESD protection device.

The specific element may be selected from the group consisting of a source-drain diffusion layer density, a pocket implantation, a source-drain diffusion depth, a gate-source-drain overlap length, a saliside block length, an impact ionization coefficient, a source-drain resistance, and a substrate resistance. The source/drain diffusion layer density is the density of the source and drain layers of an MOSFET or ESD protection device. The pocket implantation, also called "halo implantation", is a high density portion provided on the source and drain side of the gate to control decrease of the threshold voltage by the short channel effect that when the source-substrate channel becomes short, the drain voltage raises the substrate potential, reducing the voltage between the source and the substrate, allowing more current to flow. The source/drain diffusion layer depth is the depth ($X_j$) of source and drain diffusion layers. The source and drain are made simultaneously by the source drain implantation step so that the diffusion layer depths are equal.

The gate source drain overlap length is the length of overlap between the gate and source or gate and drain layers. The saliside block length is the length of a region to block the saliside. The saliside block is a region with no saliside to raise the resistance of the drain region (sometime including the source region) or the breakdown resistance of only the ESD protection device with respect to the saliside forming region provided to reduce the drain resistance. The impact ionization coefficient $\alpha$ is the coefficient for the impact ionization rate G corresponding to the number of electrons and holes generated per second per volume. The impact ionization rate G ($cm^{-3}/s$) is given by $\alpha \times (J/q) \times \exp(E)$ wherein the J is the current density, E the electric field, q the charge. The source/drain resistance is the resistance of the added source and drain. The substrate resistance is the resistance of a wafer on which the ESD protection device is formed and is equal to the resistance of a substrate that is not included in the analyzing area.

With such a specific element, it is possible to differentiate the characteristic of the ESD protection device. According to the modeling level, the parameters can be set for all of the specific elements but, in the simple modeling in the initial simulation, an easily derived element may be extracted from the specific element group to set the parameter. The specific element for which the parameter is determined according to the impurity profile may be the source/drain diffusion layer density, the pocket implantation, the source/drain diffusion layer depth, the overlap length, and the saliside block length.

According to another aspect of the invention there is provided an ESD simulation method of simulating an ESD resistance of an integrated circuit including an ESD protection device, comprising the step of providing a breakdown voltage where an ESD breakdown takes place in an actual device; finding a reference voltage applied to each element when the breakdown voltage is applied artificially to the modeled integrated circuit; comparing the reference voltage and a voltage upon the each element of a newly modeled integrated circuit to estimate a breakdown location and an ESD resistance of the integrated circuit.

The model made by the ESD protection device modeling method is used appropriately in the simulation. The modeling method is not a mere conversion to the equivalent circuit so that it is possible to simulate the voltage locally generated in each ESD protection element, thereby making it possible to predict the ESD breakdown location or the ESD resistance.

As has been described above, according to the invention, the characteristic of an ESD protection device is predicted by a simple process without difficulty. Even if the production process is changed, the parameter of only the specific element depending on the process change is changed to predict the characteristic change of the ESD protection device after the process change. The use of measurements of the device after the process change enables to provide a more reliable simulation model. Furthermore, it is possible to predict the ESD destruction location or ESD resistance after the process change.

DESCRIPTION OF THE PREFERRED EMBODIMENTS

First Embodiment

Figure 1:
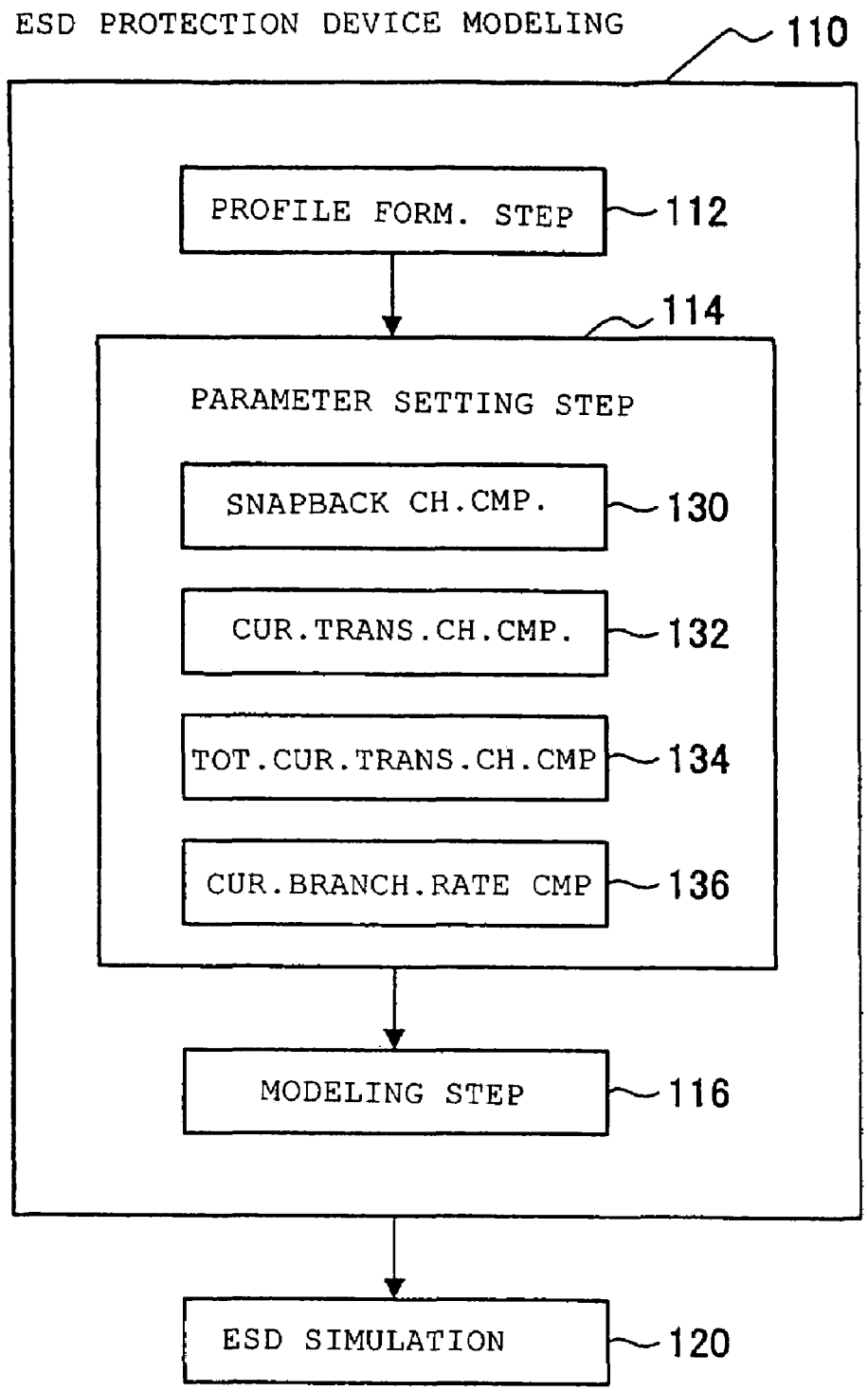
FIG. 1 is a flow chart for modeling an ESD protection device.

In FIG. 1, an ESD protection device modeling method 110 includes a profile forming step 112, a parameter setting step 114, and a modeling step 116. The modeled ESD protection device is simulated along with other Ics by an ESD simulation method 120.

In the profile forming step 112, an impurity profile is made by the secondary ion mass spectrometry. Such an impurity profile may be made by a process simulation for a production process. Also, an inverse modeling technology may be used to extract an impurity profile by simulation using the measured electrical characteristics of a device. The impurity profile determines the source-drain diffusion layer density, the pocket implantation, the source-drain diffusion layer depth, the overlap length, and the block length of a saliside among the specific elements or factors necessary for modeling an ESD protection device.

The parameter setting step 114 sets the parameters of a plurality of specified elements. Where the profile forming step 112 is executed, the parameters of a predetermined number of specified elements among the specific elements are determined, and the parameters of the impact ionization coefficient, source-drain resistance, and substrate resistance are set here. In this way, only the parameters for the specified elements are set independently to form the characteristics of the ESD protection device. Especially, where there is a change in the production process due to a circuit correction or the like, the parameter of only the specific element that is affected by the process change is changed in setting to form a new model for the ESD protection device.

Where the parameter of each specific element is known, the parameter is set, and the parameter difficult to be predicted is set by using the snapback characteristic comparison 130 or the current transition characteristic comparison 132. Where there are a plurality of ESD protection devices or elements including n-channel and p-channel MOSFETs, the total current transition characteristic comparison 134 or the current branching rate comparison 136 is used to form a comprehensive model for the ESD protection devices. Although there are a plurality of ESD protection devices, the base is modeling each ESD protection device, and the total current transition characteristic comparison 134 and the current branching rate comparison 136 are used to correct the difference between the measurement and the setting.

The snapback characteristic comparison 130 compares the snapback characteristics of an actual device measured by the TLP method and those of a specific element to set the parameter for the specific element. Specifically, the specific element to be set is selected from a group of specific elements, and the shape of snapback characteristics of the measurement is compared with that of the selected specific element so that it approaches the measured snapback characteristic curve. Finally, the parameters of the set specific elements are summed up to do simulation to check if it is substantially equal to the measured snapback characteristics.

Figure 2:
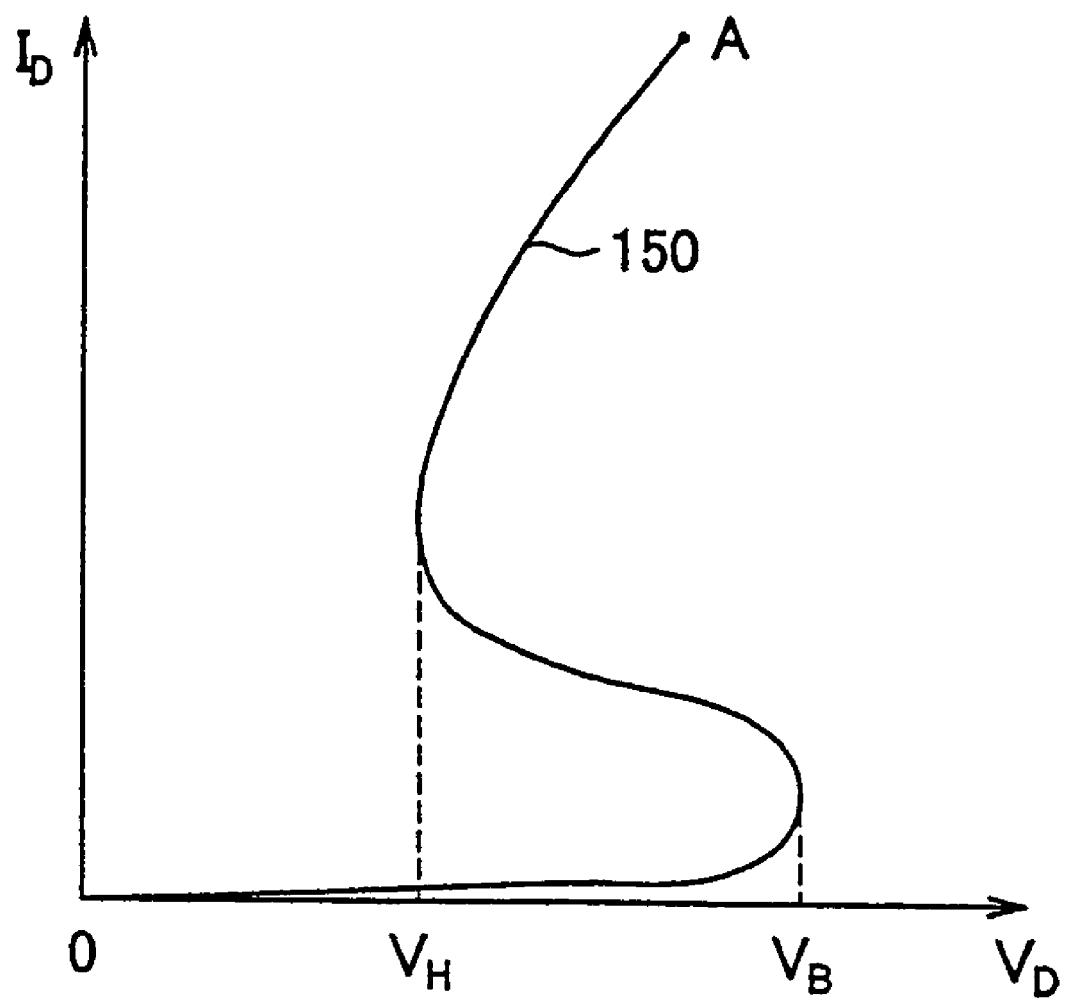
FIG. 2 is a graph showing the snapback characteristic of a current/voltage curve.

In FIG. 2, the snapback characteristic is represented by an operation trace 150 of the drain current $I_D$ versus the drain voltage $V_D$ with the gate and source voltages fixed at 0 volt. When the drain voltage $V_D$ reaches the breakdown voltage $V_B$, a predetermined value of current flows due to the avalanche breakdown, and the drain voltage $V_D$ becomes the holding voltage $V_H$. When the current further increases, it reaches the thermal runaway A, which is normally a breakdown point. The breakdown voltage $V_B$ Of the ESD protection device is set higher than the operation voltage of an IC to use such a snapback action so that the current of electrostatic discharge flows through the ESD protection device to protect the other circuits.

The current transition characteristic comparison 132 compares the current transition characteristic measured by conducting current through the ESD protection device and that of the specific element to set a parameter for the specific element. The specific comparison method is the same as the snapback characteristic. The parameter set by the snapback characteristic comparison 130 may be adjusted by the current transition characteristic comparison 132. The setting may be made in the reverse order, too. In this way, a reliable model is provided.

The total current transition characteristic comparison 134 compares the total current transition characteristic measured by conducting current through the ESD protection devices and the current transition characteristic resulting from the simulation of each of the ESD protection elements to set a parameter for the current ratio or the resistance of a wire connected to each ESD protection element or device.

The current branching rate comparison 136 compares the current branching rate obtained by measuring the rate of current through each ESD protection device and the current branching rate of each ESD protection device on the simulation to set the parameter for the current ratio in the same way as in the total current transition characteristic comparison 134.

The modeling step 116 models the electrical characteristic of an ESD protection device with the parameter of a specific element. The parameter of the specific element is incorporated directly or indirectly in the device simulation to be used in the simulation of an ESD protection device.

The ESD simulation method 120 simulates the ESD resistance in a circuit including the modeled ESD protection device in the modeling step 116. In this ESD simulation method, an actual device is used to cause an ESD to provide the breakdown voltage where the ESD occurred. The breakdown voltage is applied to an IC in the modeled simulation to take a voltage on each device as a reference voltage. Where there is a process change due to a circuit correction or the like, the voltage of each device of a new modeled IC is compared with the reference voltage to estimate the breakdown location and ESD resistance of the IC.

In the ESD protection device modeling method 110, it is necessary to measure in advance the snapback characteristic for the parameter of each specific element. Once the snapback characteristic is measured for each specific element, the measurement can be used for a similar simulation, thus facilitating the characteristic assessment. The specific element depends on the production process so that even if the production process is changed, the parameter of only the specific element depending on the process change is changed to predict the characteristic change of the ESD protection device after the change without difficulty.

This easiness in the characteristic prediction of an ESD protection device becomes clearer by comparison with the conventional characteristic prediction. Heretofore, a model for the equivalent circuit of an ESD protection device is assumed, and the device made by the final process is measured, or the physical parameter is extracted from the electrical characteristic of a device simulation to form an equivalent circuit. It takes a very large amount of time to set all the parameters by adjusting the physical parameters of the device simulation. Then, it is necessary to adjust 100 or more model parameters for the equivalent circuit.

By contrast, in the above embodiment, only the parameters of specific elements depending on the process change are adjusted or about eight parameters are set to model the ESD protection device, thus providing a characteristic perdition in a short time without difficulty. Where the production process is changed due to a circuit correction or the like, the conventional method cannot use the previous model parameters and requires again adjustment of the model parameters for forming an equivalent circuit. In this embodiment, however, only the parameter depending on the process change is changed to provide without difficulty a prediction of the characteristic change of the ESD protection device after the change.

In addition, where a more reliable simulation model is formed, measurement is taken of the device after the change of a production process, and the parameter of the specific element is predicted from the result. In this way, the optimal simulation of an ESD protection device is made. Even if the production process is changed, it is easy to predict the characteristic change of an ESD protection device.

Second Embodiment

In the second embodiment, the profile forming step 112 and the parameter setting step 114 will be described in details. In the parameter setting step 114, especially, the snapback characteristic comparison 130 will be described.

Figure 3:
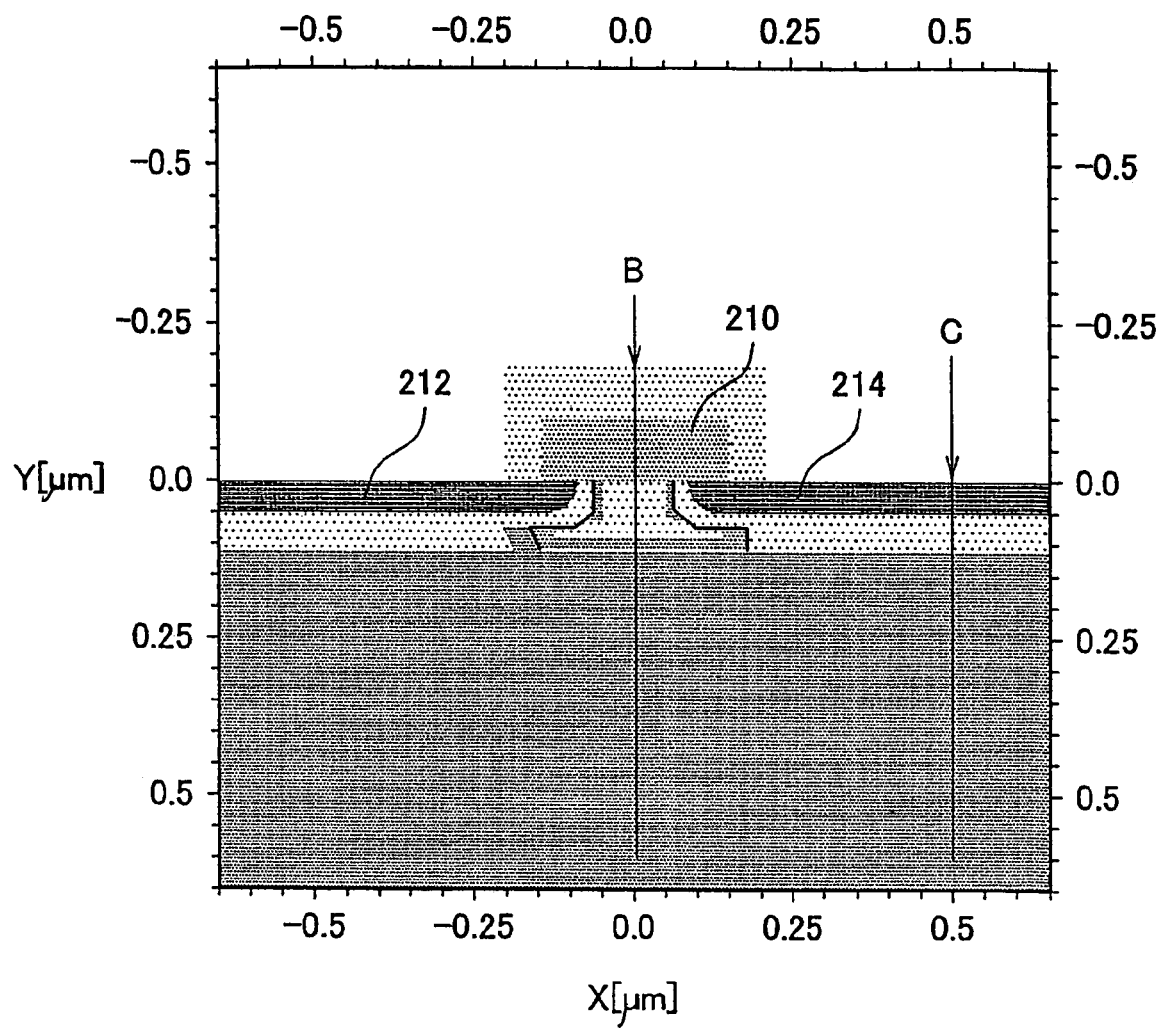
FIG. 3 is a diagram showing the impurity profile of an ESD protection device.
Figure 4:
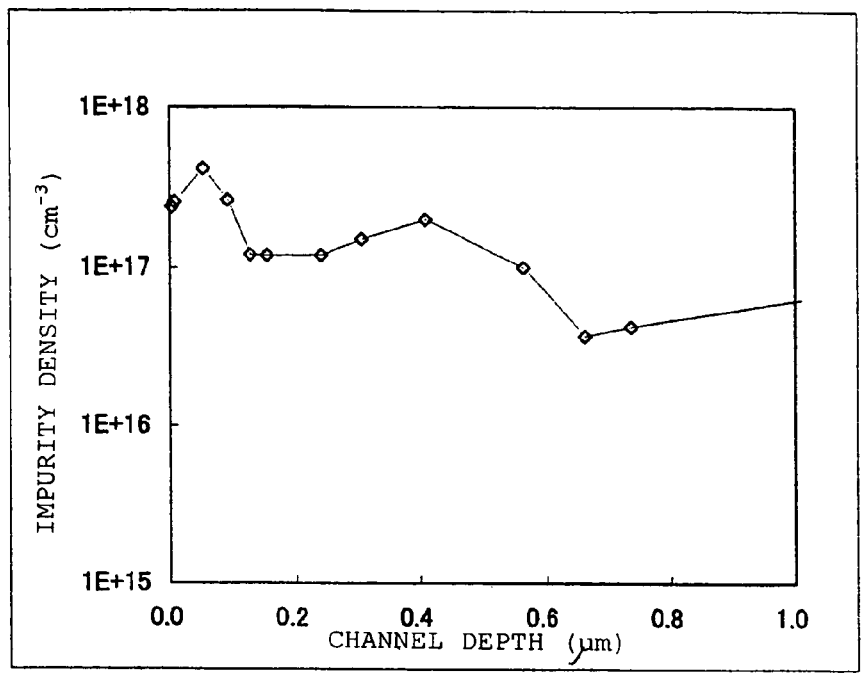
FIG. 4 is a graph showing the impurity density in the direction of a channel depth.
Figure 5:
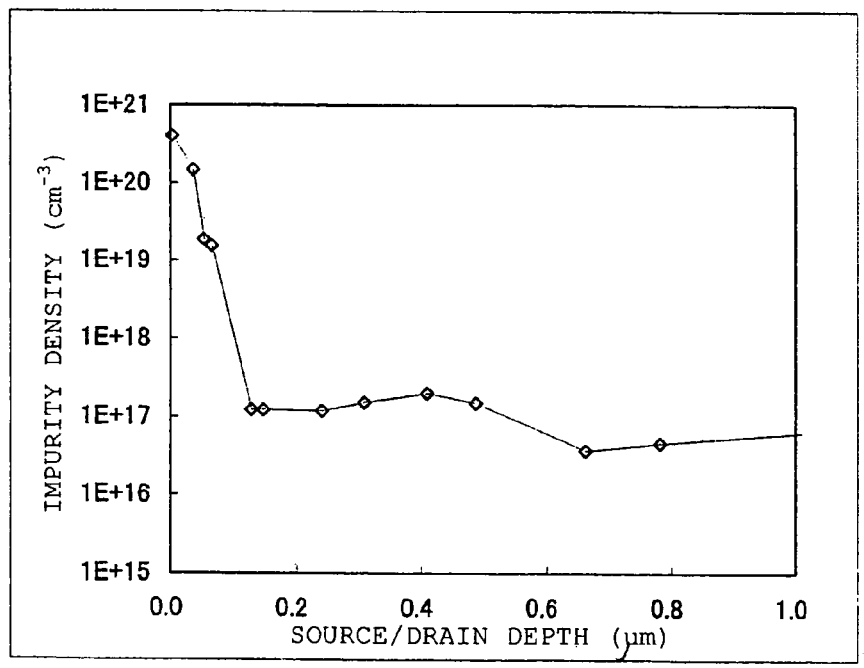
FIG. 5 is a graph showing the impurity density with respect to the source-drain depth.

In FIG. 3, the ESD protection device is represented by an MOSFET including a gate 210, a source 212, and a drain 214. The impurity distribution B in the channel direction is shown in FIG. 4, wherein the impurity density is plotted against the channel depth. The impurity density C in the source-drain direction is shown in FIG. 5, wherein the impurity density is plotted against the source-drain depth. These densities and the density ratio of each portion have great influence on the electrical characteristic of an ESD protection device.

The impurity profile enables to determine the parameter for a specific element, such as the source-drain diffusion layer density, the pocket implantation, the source-drain diffusion layer depth, the overlap length, and the block length of a saliside, and, in the parameter setting step 114, the parameter of only the impact ionization coefficient, the source-drain resistance, and the substrate resistance. The above parameters may be set by prediction from the changed element in the production process but, in this embodiment, the setting of parameter by the snapback characteristic comparison 130 will be described.

First of all, the snapback characteristic of an ESD protection device is obtained by the TLP measurement of an actual device. Then, it is compared with the snapback characteristic of each specific element that has been prepared in advance to calculate the parameter. This method is based on the estimation of an unknown parameter of a specific element resulting from the assumed result. Consequently, it is necessary to compare the curve of snapback characteristic in the parameter of each specific element with that of the measured snapback characteristic.

Figure 6A:
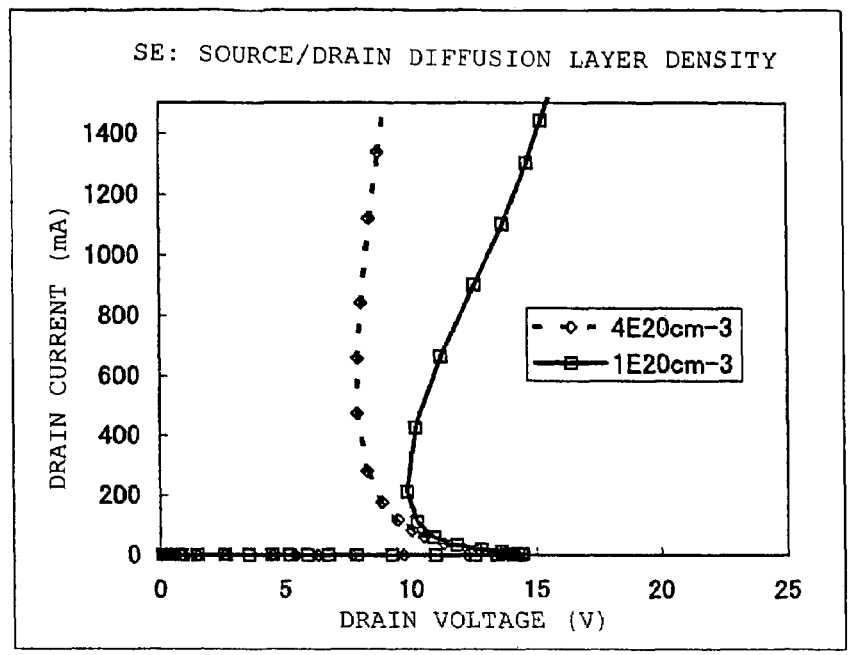
FIG. 6(A) is a graph showing snapback characteristics for a source-drain diffusion layer density.

In FIG. 6A, only two source-drain diffusion layer densities $4 \times 10^{20/cm3}$ and $1 \times 10^{20/cm3}$ are given for simplicity purpose, but more parameters may be included. It is apparent from the curves that the gradient angle of avalanche breakdown varies with the parameter.

Figure 6B:
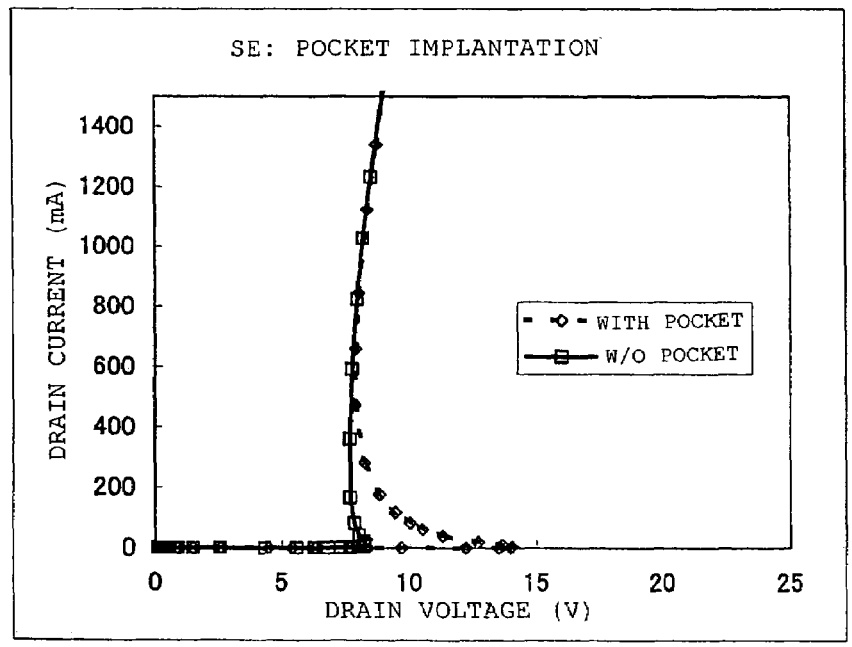
FIG. 6(B) is a graph showing snapback characteristics for a pocket implantation.

In FIG. 6B, two cases where there is a pocket and there is no pocket are shown. It is apparent that the curve of the pocket case slower than that of the none pocket case from the avalanche breakdown to the holding voltage.

Figure 6C:
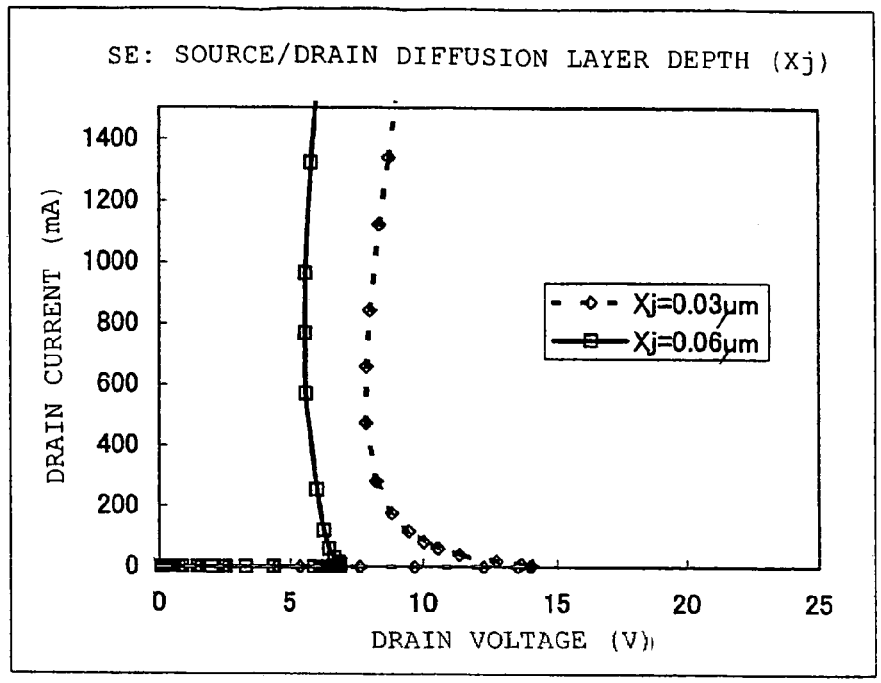
FIG. 6(C) is a graph showing snapback characteristics for a source-drain diffusion layer depth.

In FIG. 6C, two cases wherein the diffusion layer depth is 0.03 um and 0.06 um are shown. The gradient angle after the avalanche breakdown is not affected by the depth of a diffusion layer but is shifted by the predetermined drain voltage.

Figure 6D:
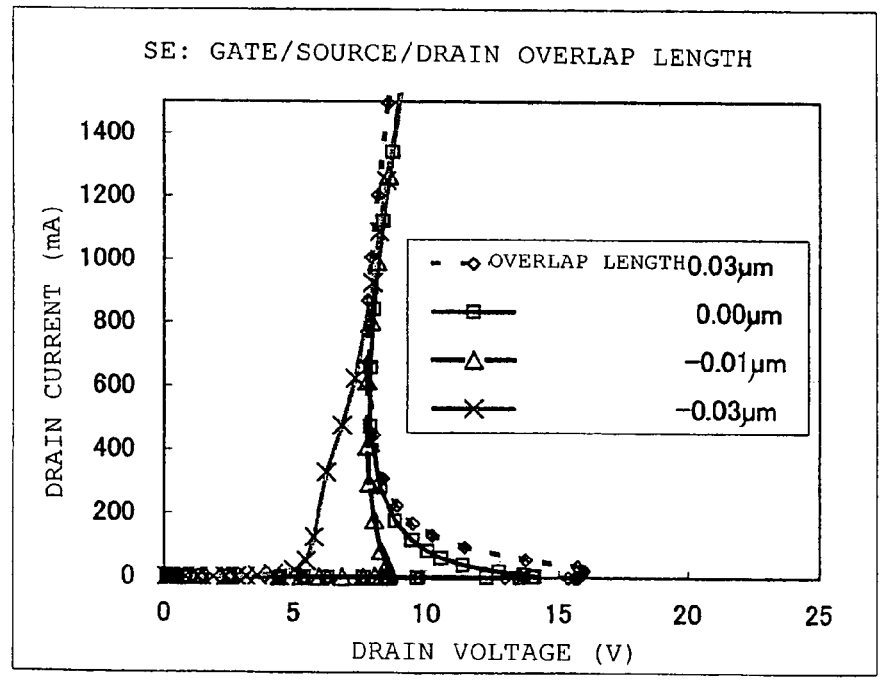
FIG. 6(D) is a graph showing snapback characteristics for a gate/source/drain overlap length.

In FIG. 6D, four overlap lengths 0.03 um, 0.00 um, −0.01 um, and −0.03 um are given. The curve after the avalanche breakdown is independent from the overlap length but the breakdown voltage before avalanche breakdown varies therewith.

Figure 6E:
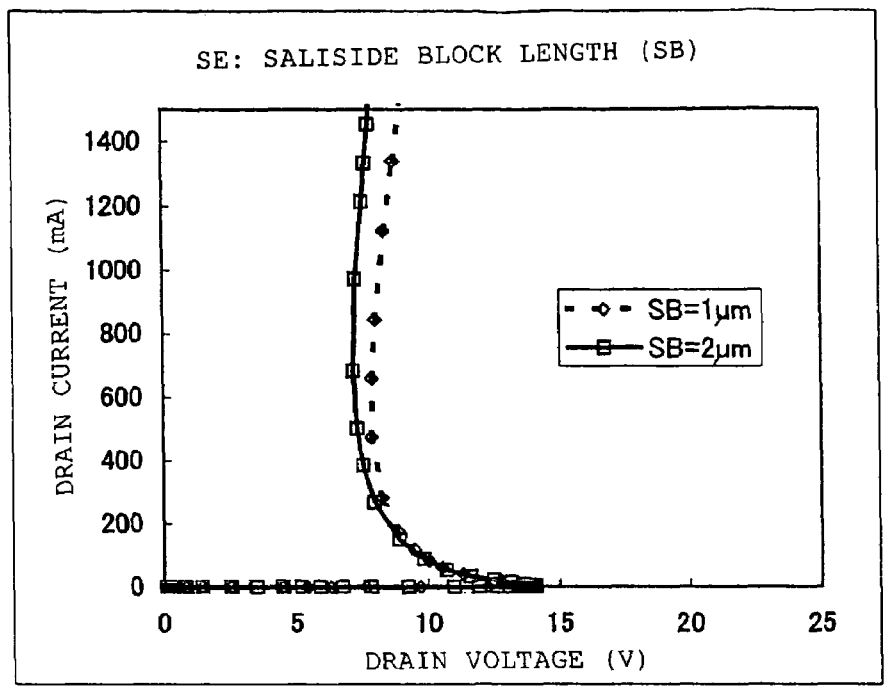
FIG. 6(E) is a graph showing snapback characteristics for a saliside block length.

In FIG. 6E, two saliside block lengths 1 um and 2 um are given. The gradient angle after the avalanche breakdown varies with the parameter.

Figure 6F:
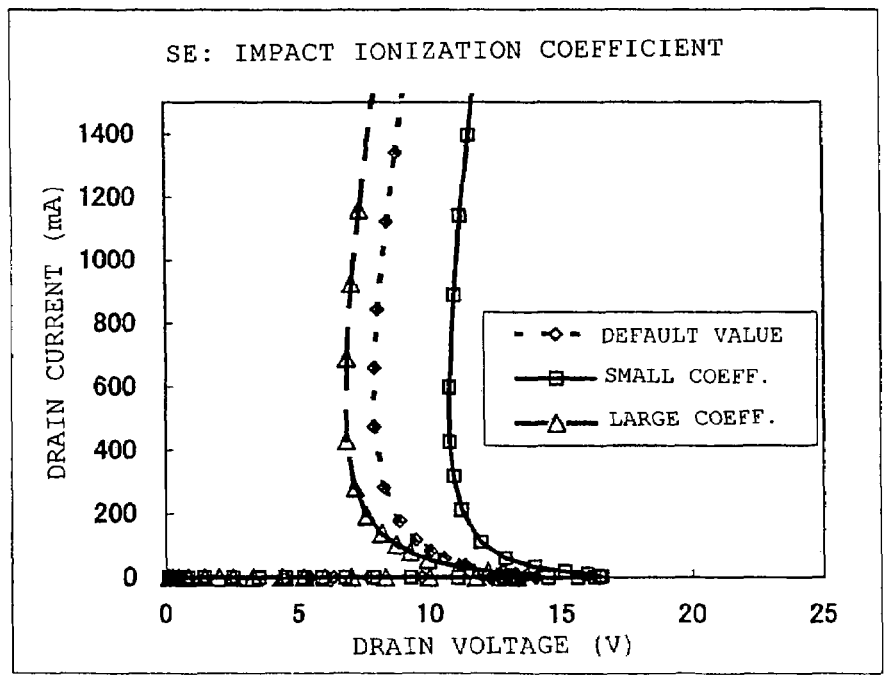
FIG. 6(F) is a graph showing snapback characteristics for an impact ionization coefficient.

In FIG. 6F, high and low impact ionization coefficients are given. The gradient angle after the avalanche breakdown is independent from the impact ionization coefficient but there is a shift by a predetermined drain voltage.

Figure 6G:
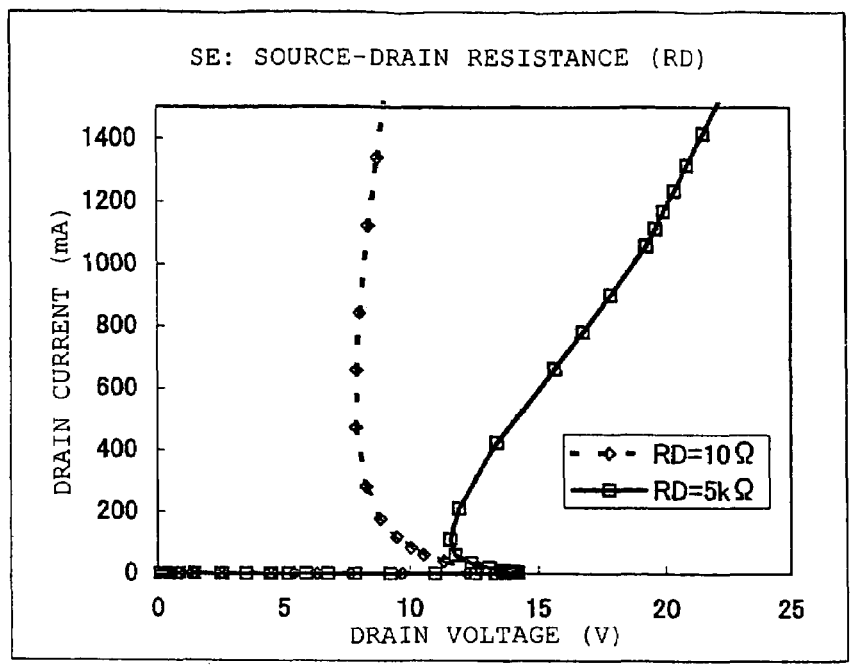
FIG. 6(G) is a graph showing snapback characteristics for a source-drain resistance.

In FIG. 6G, two drain resistances 10 and 5 k ohms are given. The gradient angle after the avalanche breakdown with respect to the vertical line for the larger source-drain resistance is larger than that of the smaller source-drain resistance.

Figure 6H:
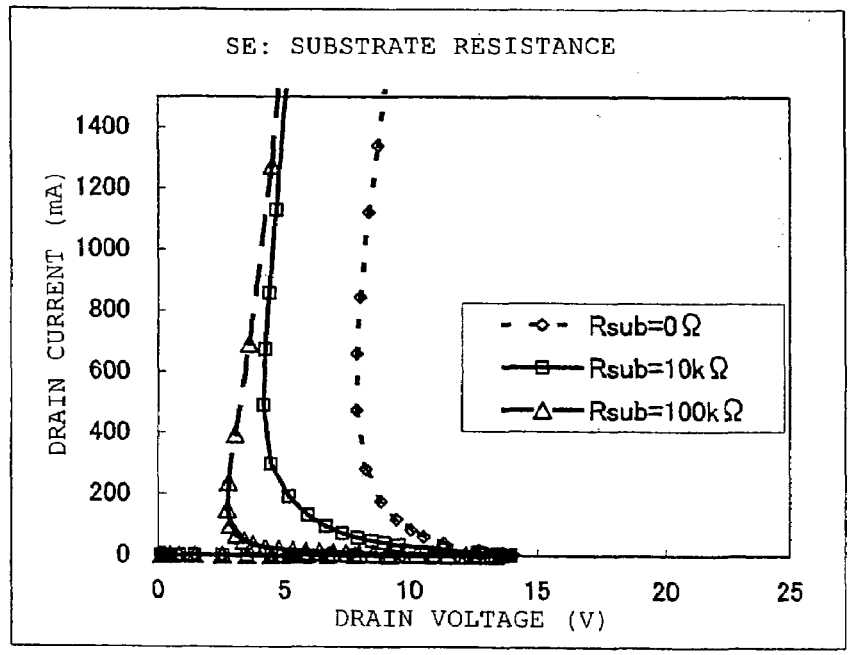
FIG. 6(H) is a graph showing snapback characteristics for a substrate resistance.

In FIG. 6H, three values of substrate resistance 0, 10 k, and 100 k ohms are given. The hold voltage and the curve after the avalanche breakdown vary with the parameter.

The change of curve with the parameter in each of the above figures can be compared with that of the measured for an actual device.

Figure 7A:
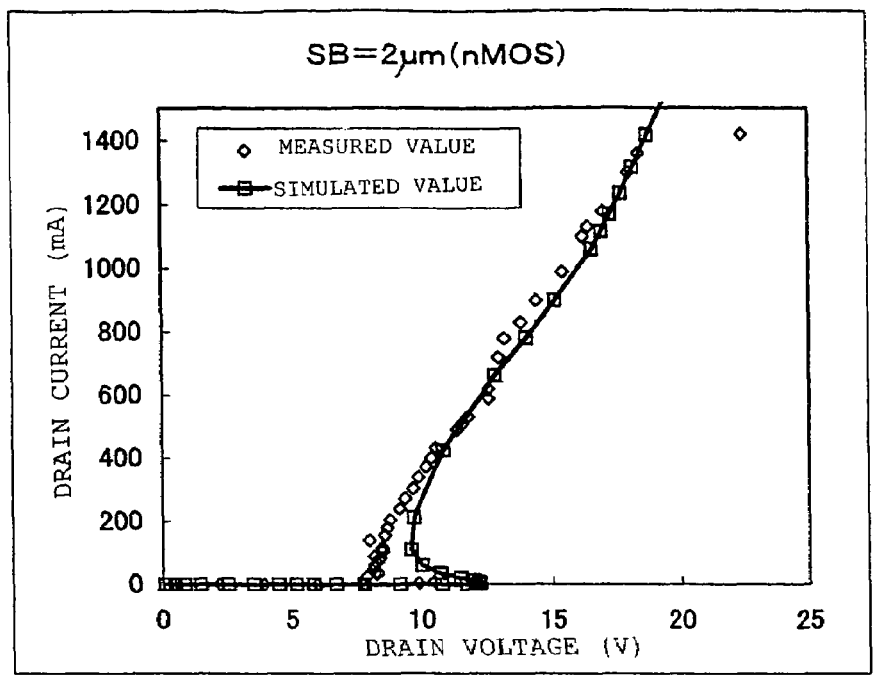
FIGS. 7(A) and 7(B) are a graph showing snapback characteristics of an nMOS model and measurements.

In FIG. 7A, the parameters determined for respective specific elements in an ESD protection device or n-channel MOSEFT are combined to provide a snapback characteristic. The simulation result expressed by solid line substantially matches the measurement curve given by a set of plots. The parameters of respective specific elements are 2 um for the saliside block length, 5 k ohms for the substrate resistance, and 4 k ohm for the source-drain resistance.

Where the production process is changed, it is easy to predict the characteristic change of the ESD circuit. For example, the saliside block length is changed from 2 um to 0.5 um, the conventional method requires readjustment of the model parameters to form an equivalent circuit but this embodiment requires change of only the parameter for the saliside block length to predict the electrical characteristics.

Figure 7B:
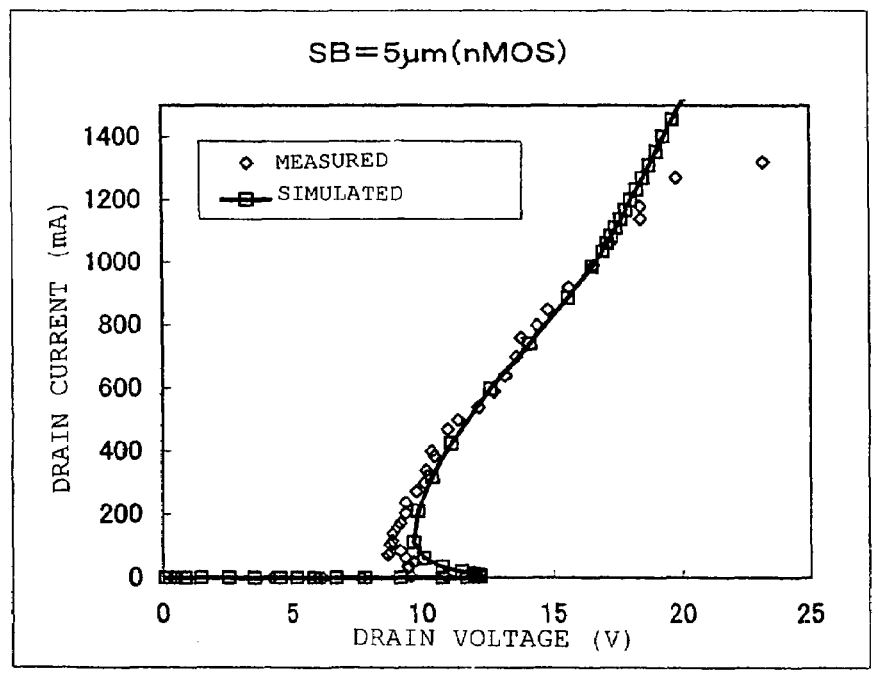

FIG. 7B shows consistency between the snapback characteristic formed by changing the parameter for the saliside block length and the snapback characteristic of measurements taken of the actual device after the change of a production process. An accurate model consistent with the actual device is provided by simply changing the parameter of a specific element that affects the electrical characteristic of an ESD protection device.

Similarly, a comparison is made between the model snapback characteristic and the measured snapback cartelistic for a p-channel MOSFET as an ESD protection device.

Figure 8A:
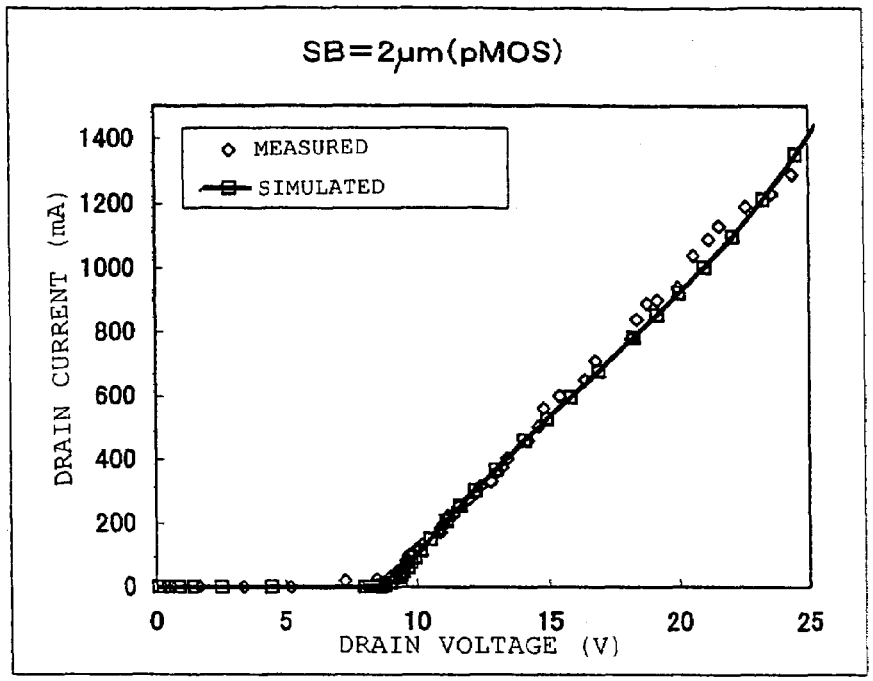
FIGS. 8(A) and 8(B) are a graph showing snapback characteristics of a pMOS model and measurements.

FIG. 8A shows the consistency between the snapback characteristic made by combining the parameters set for respective specific elements and the snapback characteristic made by measuring an actual device.

Figure 8B:
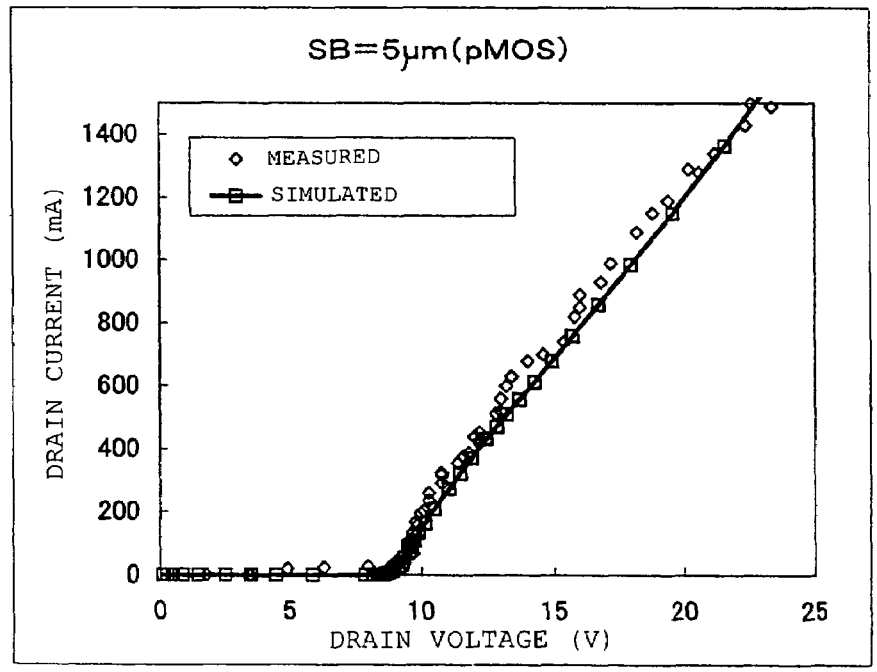

FIG. 8B shows the comparison between the simulation and the measurement where the saliside block length is changed from 2 um to 5 um to form an ESD protection device. As shown, an accurate model is provided for the p-channel MOSFET by simply changing the parameters of specific elements that affect the electrical characteristics of the ESD protection device.

Third Embodiment

In the third embodiment, the parameter setting step 114 for the total current transient characteristic comparison 134 and the current branching rate comparison 136 will be described in details. A plurality of MOSFETs are provided for an ESD protection device. The parameters for each MOSFET have been determined by the snapback characteristic comparison 130 or the current transient characteristic comparison 132 in the parameter setting step 114. The total current transient characteristic comparison 134 and the current branching rate comparison 136 are used to finely adjust or correct the parameters determined by the snapback characteristic comparison 130 or the current transient characteristic comparison 132.

Figure 9:
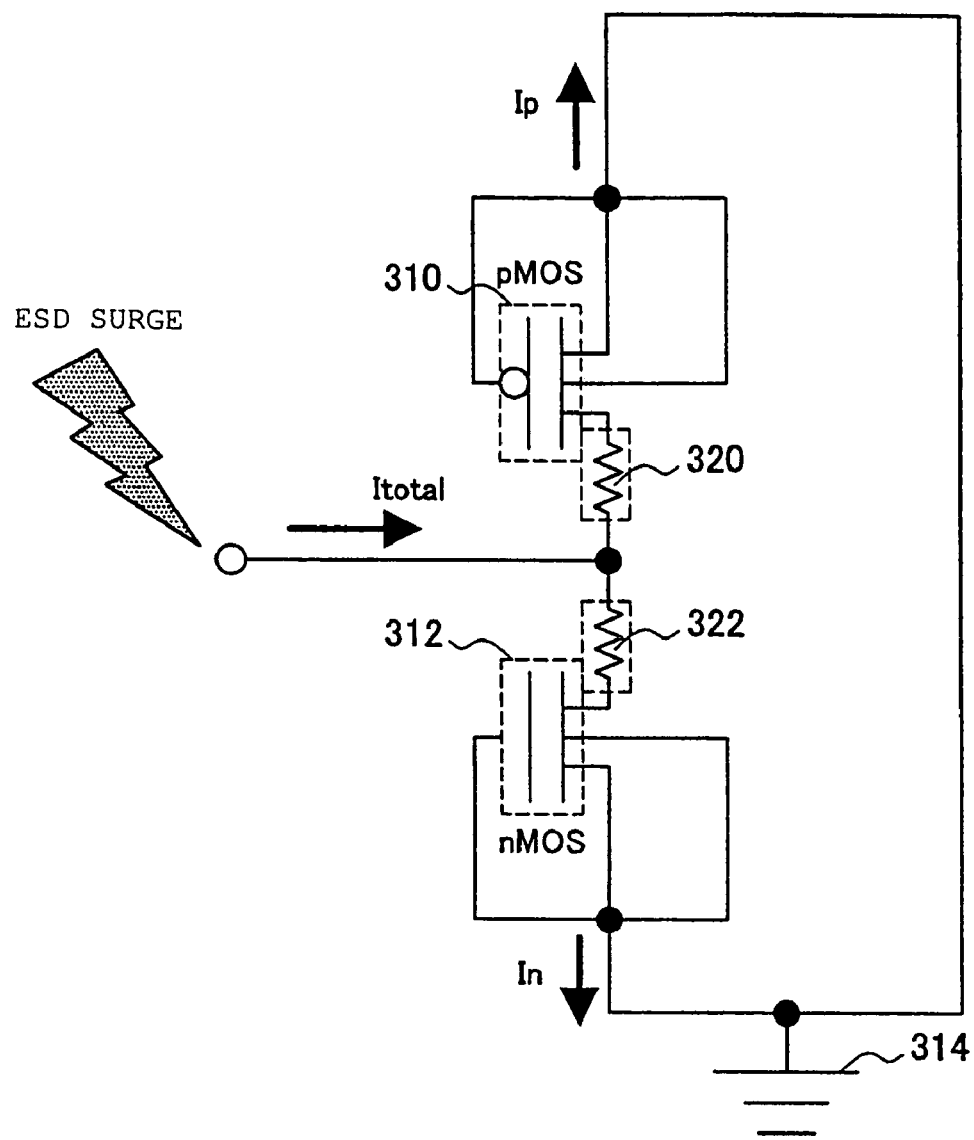
FIG. 9 is a circuit diagram of an ESD protection device including two MOSFETs.

In FIG. 9, an ESD protection device is composed of a p-channel MOSFET or pMOS 310 and an n-channel MOSFET or nMOS 312. An ESD surge voltage is applied to the pMOS 310 and nMOS 312 in parallel. The produced current is discharged to a device ground 314 through the pMOS 310 (Ip) and nMOS 312 (In).

Figure 10:
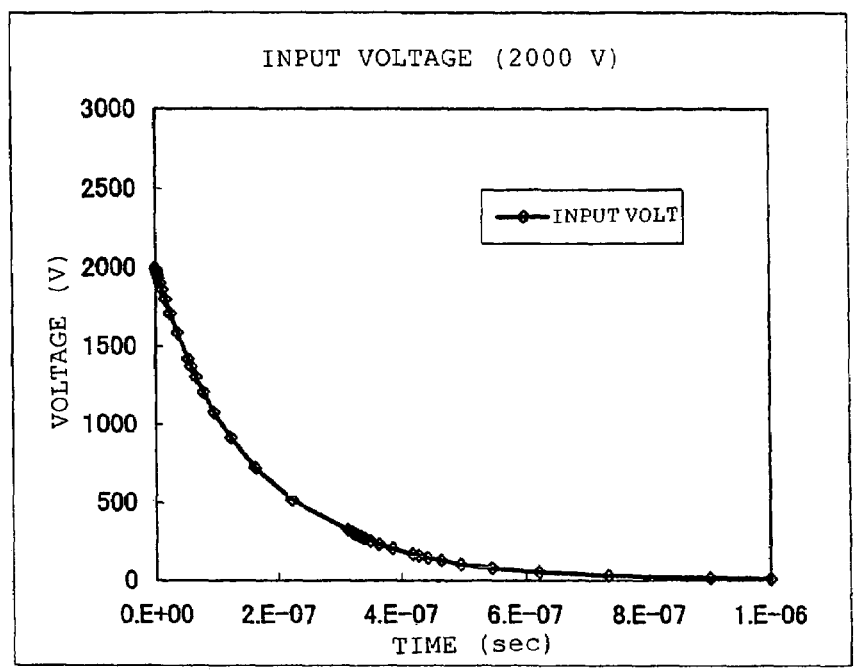
FIG. 10 is a graph showing a transient voltage input to the ESD protection device.

FIG. 10 shows the transient voltage input to the ESD protection device in transient analysis. A voltage as high as 2000 V is applied instantly to check the function of the ESD protection device. In the total current transient characteristic comparison 134, the total current transient characteristic measured by conducting current through two ESD protection elements and the current transient characteristic resulting from the simulation of each ESD protection element of the ESD protection device are compared. The parameter for the current ratio is set such that the total current transient characteristic is substantially equal to the measured total current transient characteristic. For example, the parameter for the current ratio is the resistance of wiring to the ESD protection elements. The ratio of currents through the ESD protection elements is changed by adjusting the pMOS wiring resistance 320 or nMOS wiring resistance 322 in FIG. 9 or adding a resistor.

Figure 11:
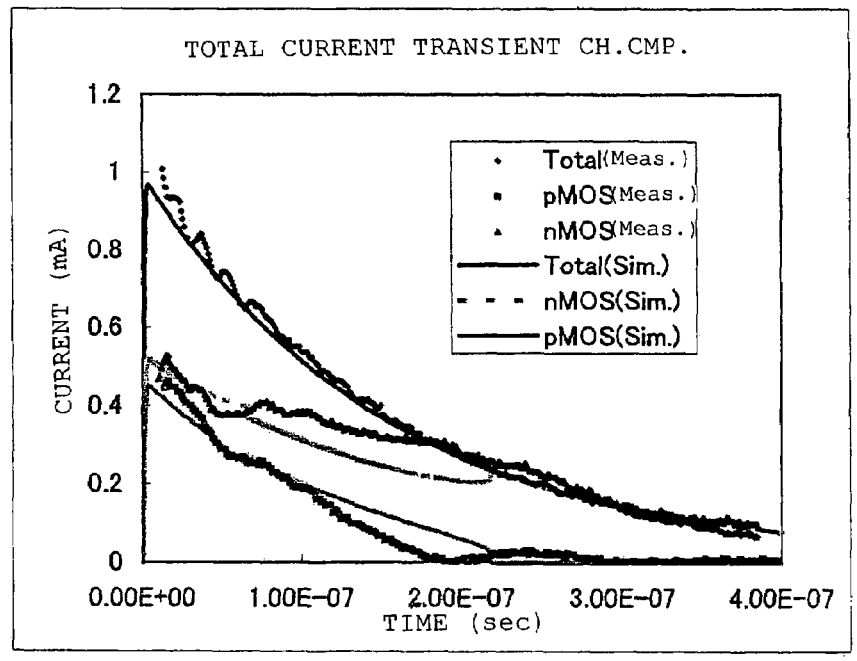
FIG. 11 is a graph showing the current transient characteristics of an ESD protection device model and measurements.

FIG. 11 shows the comparison between the current transient characteristic of the ESD protection device with the parameter set and the measured current transient characteristic of the ESD protection characteristic. Fitting or adjustment is made for three current transient characteristics of currents through the pMOS, nMOS, and two MOSFET. The resultant transient characteristics are satisfactorily close to the measured transient characteristics.

Similarly to the total current transient characteristic comparison 134, the current branching rate comparison 136 is used to set the paramour by comparing the current branching rate measured by conducting current through two ESD protection elements and the simulated current branching rate of the respective ESD protection elements. The parameter for the current ratio is set such that the current branching rate for the respective ESD protection elements is substantially equal to the measured current branching rate. For example, the parameter for the current ratio is the resistance of wiring of the respecting ESD protection elements. The ratio of currents flowing through the ESD protection device is changed by adjusting the pMOS wiring resistance 320 and the nMOS wiring resistance 322 or adding a resistor to the ESD protection device.

Figure 12:
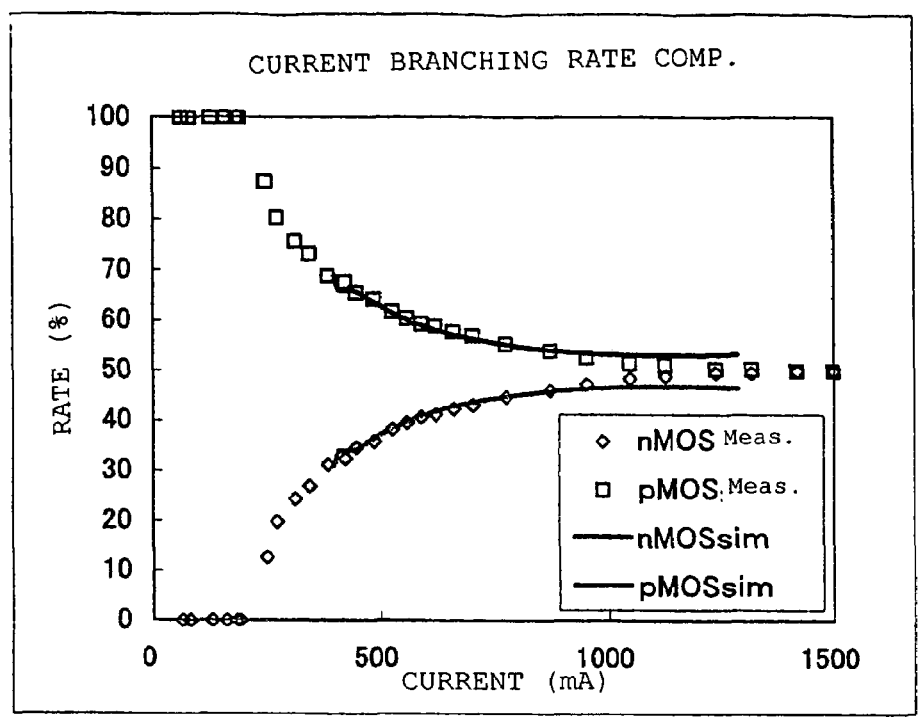
FIG. 12 is a graph showing the current branching rates of an ESD protection device model and measurements.

FIG. 12 shows the comparison between the current branching rate of the thus set ESD protection device and that of the measured ESD protection device. Fitting or adjustment is made for the current branching rate of the pMOS 310 and the nMOS 312. The resultant transient characteristic is satisfactorily close to the measured one. In the current branching rate comparison 136, measurement may be made by changing a direct current for each predetermined current interval.

In the total current transient characteristic comparison 134 and the current branching rate comparison 136, it is noted that where the two ESD protection elements are an nMOS and a pMOS, when one of them forms the snapback characteristic, the other has a drain bias of the sign opposite to the snapback characteristic, forming a forward characteristic. In this case, too, the parameter is required to meet both the characteristics.

Fourth Embodiment

In this embodiment, the ESD simulation method 120 of the ESD protection device modeled by the ESD protection device modeling method 110 will be described. The ESD breakdown location or resistance will be predicted.

Figure 13:
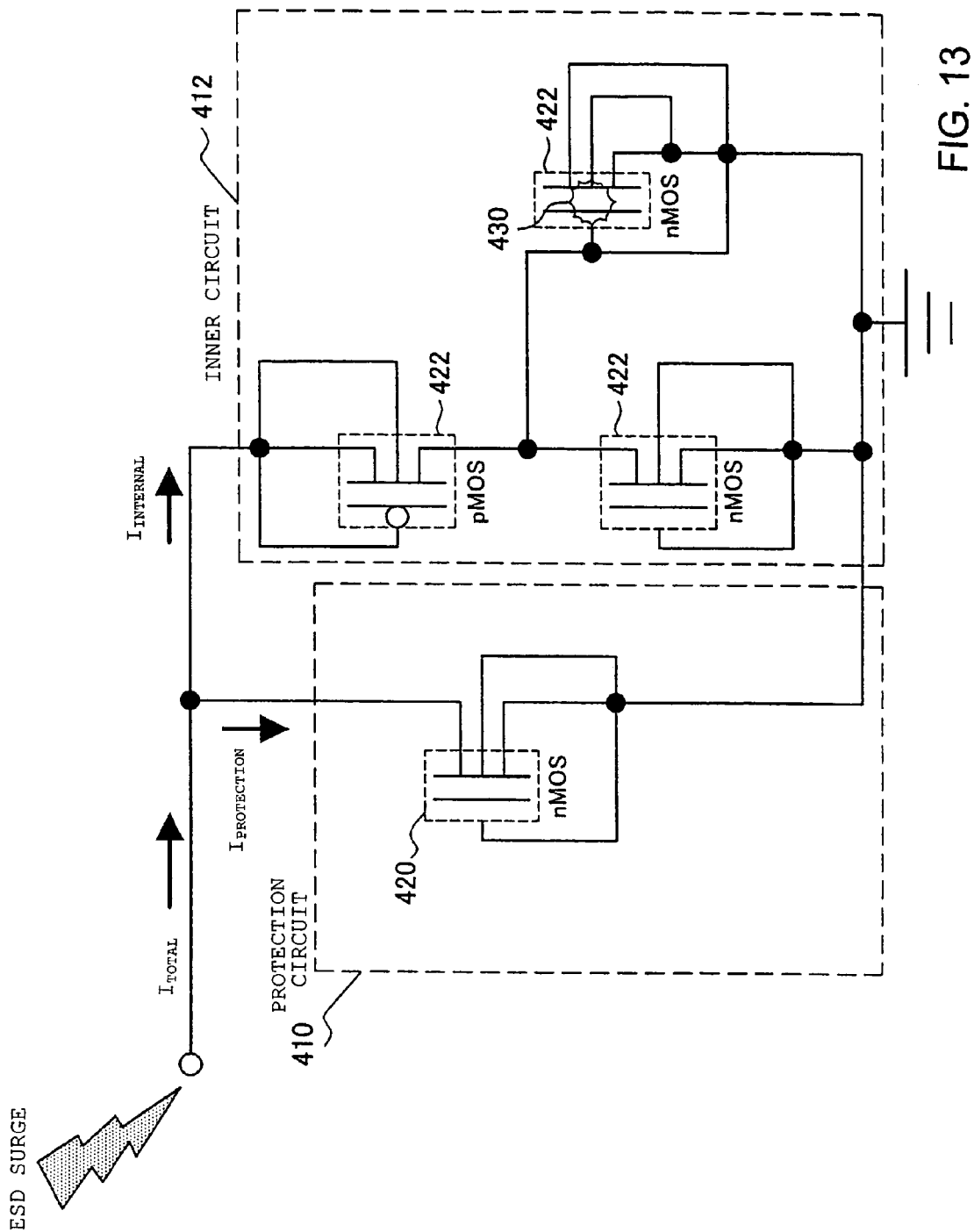
FIG. 13 is a circuit diagram of a circuit including an ESD protection device.

FIG. 13 shows a circuit including an ESD protection device to be simulated. The circuit includes a protection circuit 410 for absorbing an ESD surge voltage and an inner circuit 412 to be protected. The protection circuit 410 includes an nMOS 420 as an ESD protection element and the inner circuit has a plurality of MOSFETs 422. Any circuit structure may be taken for the protection circuit 410 and the inner circuit 412.

Prior to change of the production process, an actual device is used to identify the breakdown location. That is, an ESD breakdown is made in the actual device, when the input pulse voltage is measured as a breakdown voltage. Then, in the simulation including the modeled ESD protection device, the simulation breakdown voltage is applied to detect the voltage applied to each MOSFET 422 of the inner circuit. The voltage upon the electrostatic breakdown portion 430 is set as a reference voltage. For example, where the reference voltage is 5 V when 100 V is applied as the breakdown voltage, the ESD resistance of the electrostatic breakdown portion 430 is 5 V.

Where the production process is changed, when the ESD protection device is modeled with the information about the above simulation kept, a circuit diagram equivalent to the circuit prior to change of the production process is provided. Then, the circuit is used to perform simulation. Where there is any portion that produces a voltage equivalent to the reference voltage of the electrostatic breakdown portion 430 before change of the production process when a predetermined voltage equivalent to the breakdown voltage to the circuit in the simulation after change of the production process is applied, the portion is identified as a breakdown location. The ESD resistance is estimated by investigating the input voltage to the circuit at a time when the electrostatic breakdown portion 430 reaches the above reference voltage (causing the electrostatic breakdown). That is, the input voltage to the circuit when the voltage upon the electrostatic breakdown portion 430 reaches the above reference voltage or 5 V is found and, if it is above the breakdown voltage before change of the production process or 100 V, for example, the ESD resistance is increased.

Alternatively, the specific element may be replaced by a specific element that is derived from a different point of view. The combination of the snapback characteristic, the current transient characteristic comparison, the total current transient characteristic comparison, the current branching rate comparison may be changed to perform the parameter setting step.

The invention claimed is:

1. An electrostatic discharge (ESD) protection device modeling method of modeling an electrical characteristic of an electrostatic discharge (ESD) protection device for simulating a circuit that includes said ESD protection device, comprising the steps of:
    forming an impurity profile representing a density distribution of an impurity in the ESD protection device with a secondary ion mass analysis method;
    using the impurity profile to determine a parameter of at least one specific element;
    setting the parameter of at least the one specific element that affects said electrical characteristic of said ESD protection device, said specific element including at least one selected from the group consisting of a source-drain diffusion layer density, a pocket implantation, a source-drain diffusion depth, a gate-source-drain overlap length, a salicide block length, an impact ionization coefficient, a source-drain resistance, and a substrate resistance; and
    modeling said electrical characteristic of said ESD protection device with said parameter of said specific element.

2. The ESD protection device modeling method according to claim 1, wherein said parameter setting step includes the step of comparing a first snapback characteristic measured by transmission line pulse (TLP) measurement for evaluating said electrical characteristic of said ESD protection device with a second snapback characteristic corresponding to said specific element, and the step of setting the parameter of said specific element so that the second snapback characteristic becomes equal to said first snapback characteristic.

3. The ESD protection device modeling method according to claim 2, wherein, in the step of comparing the first snapback characteristic with the second snapback characteristic, said second snapback characteristic has been measured in advance.

4. The ESD protection device modeling method according to claim 1, wherein said parameter setting step further includes the step of comparing a first current transient characteristic measured by conducting current through said ESD protection device with a second current transient characteristic of the specific element, and the step of setting the parameter of said specific element so that the second current transient characteristic becomes equal to the first current transient characteristic.

5. The ESD protection device modeling method according to claim 4, wherein, in the step of comparing the first current transient characteristic with the second current transient characteristic, said second current transient characteristic has been measured in advance.

6. The ESD protection device modeling method according to claim 1, wherein said parameter setting step further includes the step of, where said ESD protection device is made up of a plurality of ESD protection elements, comparing a first current transient characteristic measured by conducting current through said ESD protection elements with a second current transient characteristic of each ESD protection element, and the step of setting the parameter for a current ratio so that said second current transient characteristic becomes equal to said first current transient characteristic.

7. The ESD protection device modeling method according to claim 1, wherein said parameter setting step further includes the step of, where said ESD protection device is composed of a plurality of ESD protection elements, comparing a first current branching rate obtained by conducting current through said ESD protection elements and a second current branching rate of each ESD protection element in said simulation, and the step of setting the parameter for a current ratio so that the second current branching rate becomes equal to said first current branching rate.

8. An ESD simulation method of simulating ESD resistance of a first integrated circuit including a first ESD protection device, comprising the steps of:
    finding a breakdown voltage where an ESD breakdown takes place in an actual device;
    modeling electrical characteristic of a second integrated circuit using the method according to claim 1;
    setting a first voltage as a reference voltage, said first voltage being applied to an element of the second integrated circuit when said breakdown voltage is simulatedly applied to said second integrated circuit;
    modeling electrical characteristic of the first integrated circuit using the method according to claim 1;
    finding a second voltage applied to the first ESD protection device when the breakdown voltage is simulatedly applied to the first integrated circuit; and
    comparing said reference voltage with the second voltage to estimate a breakdown location and the ESD resistance of said first integrated circuit.

* * * * *